US006757167B2

(12) United States Patent
Page et al.

(10) Patent No.: US 6,757,167 B2
(45) Date of Patent: Jun. 29, 2004

(54) HINGED ADJUSTABLE COMPONENT HOLDER FOR ELECTRONIC COMPONENT CABINET

(75) Inventors: Russell D. Page, Palmyra, NY (US); William H. Thompson, Pittsford, NY (US)

(73) Assignee: Upstate Systems Tec, Inc., Victor, NY (US)

( * ) Notice: Subject to any disclaimer, the term of this patent is extended or adjusted under 35 U.S.C. 154(b) by 0 days.

(21) Appl. No.: 10/139,425

(22) Filed: May 6, 2002

(65) Prior Publication Data

US 2002/0167796 A1 Nov. 14, 2002

Related U.S. Application Data

(60) Provisional application No. 60/289,776, filed on May 9, 2001.

(51) Int. Cl.[7] .................................................. H05H 7/20
(52) U.S. Cl. ........................ 361/690; 361/600; 361/679; 361/640; 454/184; 62/259.2
(58) Field of Search ................................ 361/600, 610, 361/679, 689–697, 724–727, 732–733, 740–741, 752, 759, 801–803, 807–810, 825–826; 454/184; 62/259.2; 165/80.2–80.3; 370/352

(56) References Cited

U.S. PATENT DOCUMENTS

| 4,079,604 A | | 3/1978 | Anderegg | ...................... 70/58 |
|---|---|---|---|---|
| 4,972,296 A | * | 11/1990 | Chu | ............................ 361/727 |
| 5,172,305 A | | 12/1992 | DeWilde | ..................... 361/415 |
| 5,561,893 A | | 10/1996 | Lee | ............... 29/434 |
| 5,572,402 A | * | 11/1996 | Jeong | .......................... 361/385 |
| 6,097,591 A | | 8/2000 | Ircha | .......................... 361/683 |
| 6,108,331 A | * | 8/2000 | Thompson | ................... 370/352 |
| 6,407,910 B1 | * | 6/2002 | Diaz et al. | ................... 361/686 |

OTHER PUBLICATIONS

U.S. patent application No. 09/662,312, "Wireless Device Connection in Single Medium Wiring Scheme for Multiple Signal Distribution in Building and Access Port Therefor".*

* cited by examiner

Primary Examiner—Gregory Thompson
(74) Attorney, Agent, or Firm—Brown & Michaels, PC

(57) ABSTRACT

This hinged adjustable component holder for electronic component cabinets relies on a holster with adjustable brackets for holding a wide variety of types and sizes of gateway devices. The holster is provided with openings on all sides to allow heat venting by a wide variety of types and sizes of gateway devices. It is also hingably connected to the component cabinet in which it is mounted so that it can be easily and simply swung in and out for mounting, adjustment, and repair purposes. Further, the holster is provided with a spacing element connecting its hinge and its body so that ample space for connecting cables is left between the gateway device and the component cabinet. Finally, the holster is firmly held in position when swung into place in the component cabinet, but can be easily detached when opened by simply lifting it off of its hinges.

26 Claims, 4 Drawing Sheets

HINGED ADJUSTABLE COMPONENT HOLDER FOR ELECTRONIC COMPONENT CABINET

This application claims the benefit of U.S. Provisional Application No. 60/289,776, filed on May 9, 2001, which provisional application is incorporated by reference herein.

TECHNICAL FIELD

This invention deals with electronic component mounting systems and particularly with means for mounting such components in electronic component cabinets.

BACKGROUND OF THE INVENTION

Previously, a gateway device such as an IE modem, a firewall, or a LAN server has not generally been integrated into a home networking system or placed within the electronic component cabinet(s) for the home networking system. Instead, these devices have been placed outside of the networking system cabinet(s) and, more often than not, are not even in close physical proximity to the cabinet(s) or each other. This leads to more equipment clutter, more difficulty setting up and trouble shooting such devices in conjunction with a home networking system, and signal loss due to longer cable runs between devices.

Ideally, such devices should be located in the component cabinet or cabinets of the home networking system. However, placing such devices in a component cabinet presents difficulties. First, many of these devices develop heat that must be vented. In addition, they have vents for heat dissipation at different locations on the outside of their cases. Thus, the mounting means or system used must make allowance for heat dissipation and must be adaptable to different vent locations on different devices. Second, when such devices are compactly mounted in the midst of other components, their control panels are not easily accessible. If the convenience sought by placing the gateway device in the component cabinet is to be maintained, the mounting means or system used should provide means for accessing the control panel for the gateway device without having to disconnect the gateway device or remove it from the component cabinet. Third, if the gateway device must be detached for easier manipulation or adjustment, it should be possible to do so with a minimum of tools and effort.

SUMMARY OF THE INVENTION

The foregoing problems have been solved by our invention of a novel hinged adjustable mounting means (or "holster") for a gateway device. Our invention is a holster and/or a holster and cabinet combination where: (1) the holster has adjustable brackets for holding a wide variety of types and sizes of gateway devices; (2) the holster is open or is provided with venting on all sides to allow heat venting by a wide variety of types and sizes of gateway devices; (3) the holster is hingably connected to the component cabinet in which it is mounted so that it can be easily and simply swung in and out for mounting, adjustment, and repair purposes; (4) the holster is provided with a spacing element connecting its hinge and its body so that ample space for connecting cables is left between the gateway device and the component cabinet; and (5) the holster is firmly held in position when swung into place in the component cabinet, but can be easily detached when opened by simply lifting it off of its hinges.

DESCRIPTION OF THE INVENTION

Figure 2A:
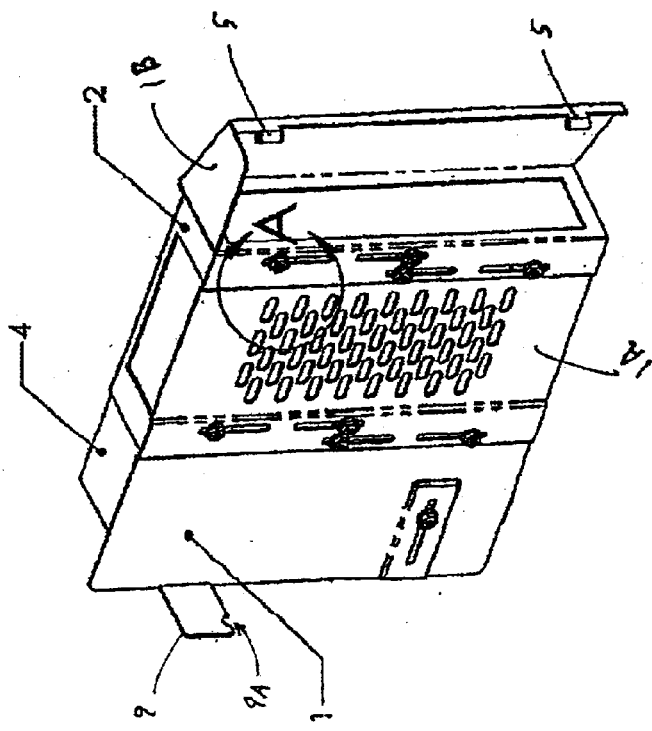
FIG. 2A provides a first perspective view from the rear and hinged side of the hinged adjustable electronic component holder of this invention with a component in place therein.
Figure 2B:
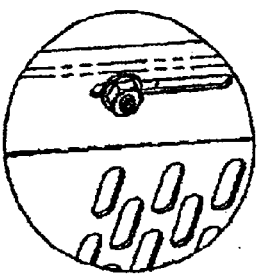
FIG. 2B provides a more detailed view of circled area A of FIG. 2A, illustrating the fastening method and slots that provide adjustability to the holder brackets.
Figure 1:
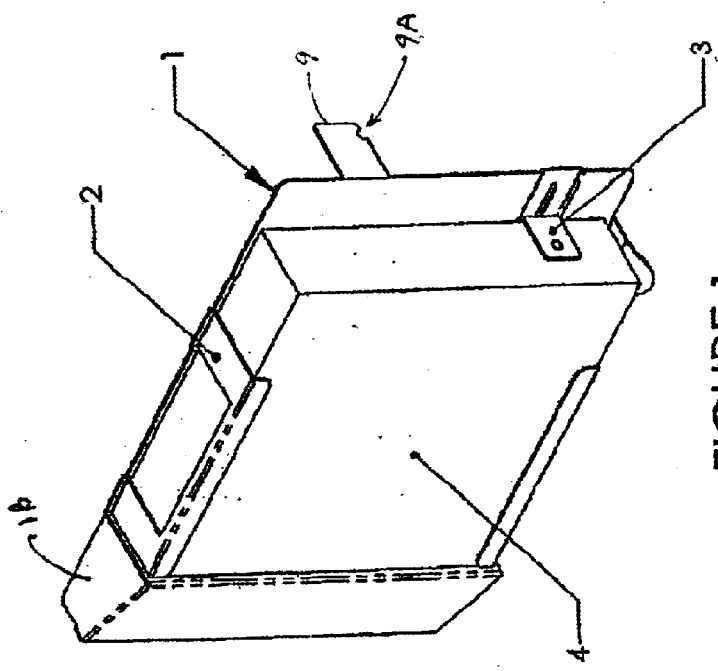
FIG. 1 provides a first perspective view from the front and non-hinged side of the hinged adjustable electronic component holder of this invention with a component in place therein.
Figure 3:
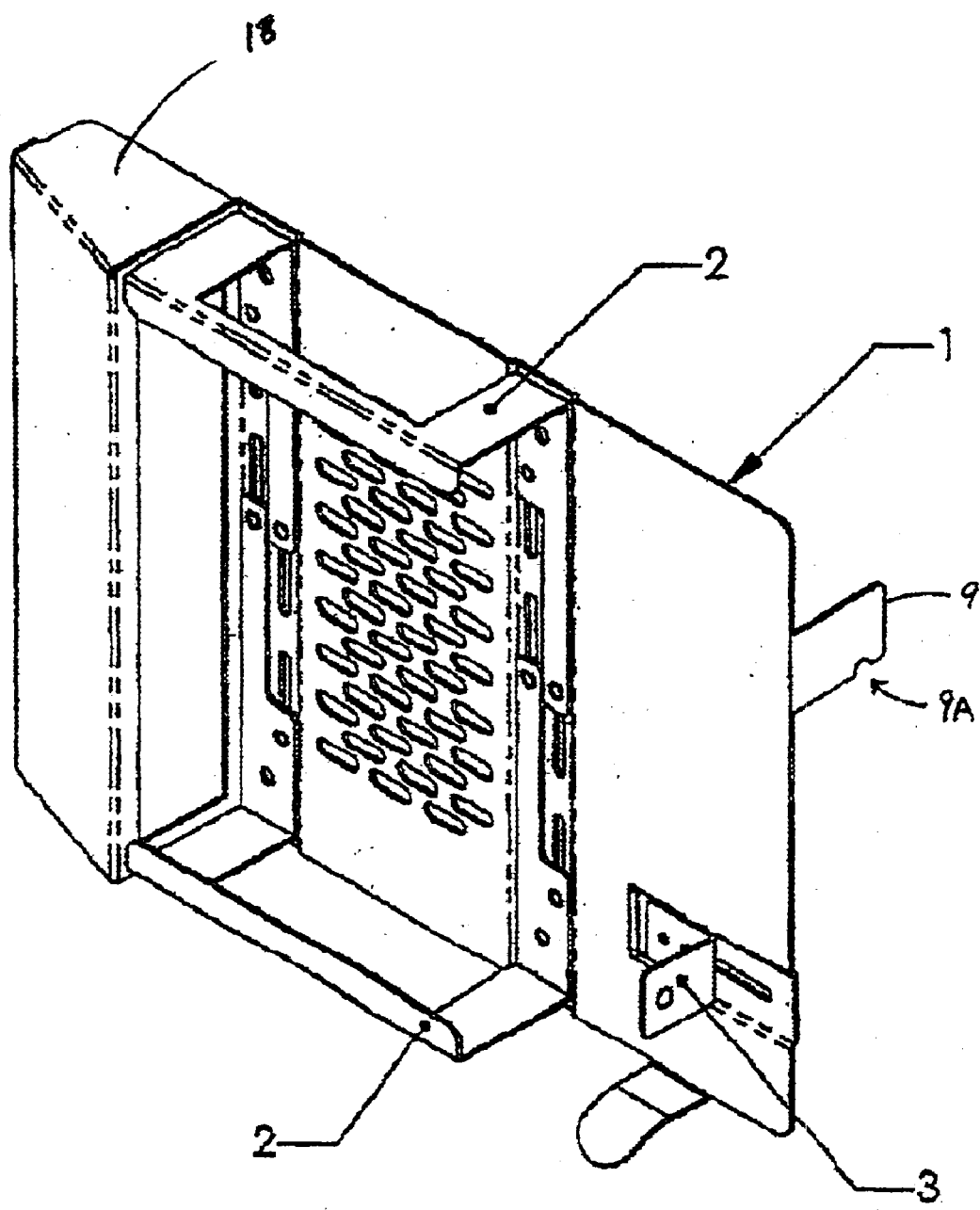
FIG. 3 provides a second perspective view from the front and non-hinged side of the hinged adjustable electronic component holder of this invention without a component in place therein.
Figure 4:
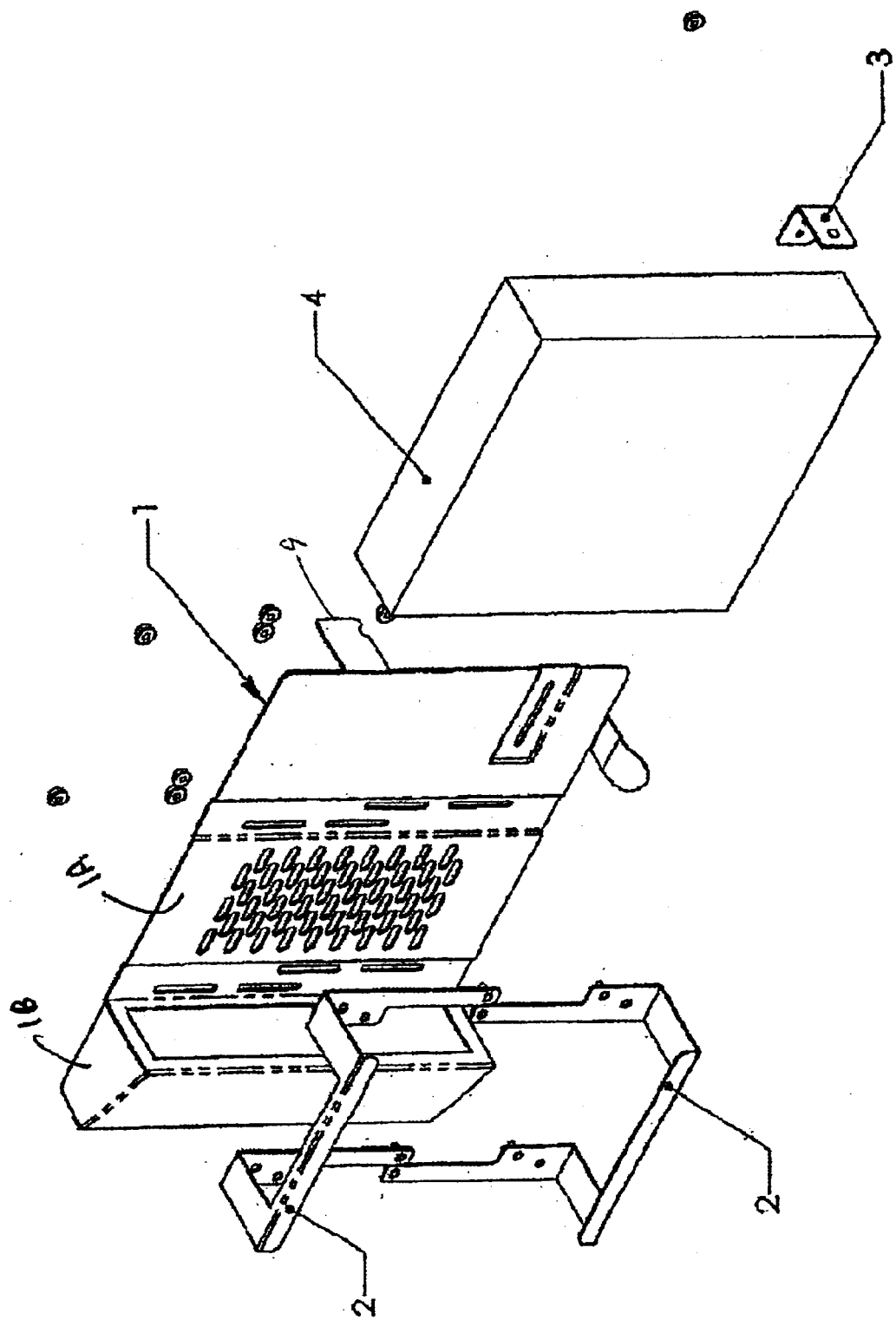
FIG. 4 provides an exploded perspective view of the hinged adjustable electronic component holder of this invention with a component.

The gateway device holster 1 of our invention is readily adjustable. It has upper and lower brackets 2 that adjust vertically as well as a retaining bracket 3 that adjusts horizontally to firmly embrace and hold a gateway device 4. After placing the gateway device 4 in holster 1, these brackets can be tightened and affixed in position via nuts, fastening the gateway device 4 firmly to holster 1.

Our holster 1 is also adapted to facilitate venting of heat from a variety of gateway devices. It is provided with venting slots at its back 1A where it abuts gateway device 4. On all other sides, the open structure of holster 1 substantially exposes the surfaces of gateway device 4. These features allow a gateway device 4 with vents located in different locations to dissipate heat via these vents without interference from holster 1.

In addition, our invention has unique adaptations to facilitate cable connection and control panel adjustment and manipulation. A review of the operation of the unique hinged structure and design of our holster 1 will illustrate how our invention accommodates both.

To begin with, the gateway device 4 is placed in holster 1 with its cable and/or line connection end adjacent hinges 5 and its control end adjacent retaining bracket 3. (The typical gateway device 4 has cable and/or line connections at one end and controls at the other.) It is then placed on the mating hinge pins 6 of its mounting brace 7 in the home networking component cabinet 10 (see, FIG. 5). The cables of the gateway device 4 can be readily connected at this stage. (The technician or owner is assisted in this operation by the fact that mounting brace 7 holds the gateway device 4 for him, freeing both of his hands for the operation.)

At this point, it should be noted that hinges 5 are spaced apart from the back 1A of holster 1 in a unique way. Back 1A does not simply extend or have extensions reaching straight to hinges 5; this would block connection of cables between the gateway device 4 and cabinet cable connection points. Instead, hinge extension 1B is formed in such a way as to leave the space between the cable connection end of the gateway device 4 and the face of cabinet 10 wide open so as to accommodate such cables. Thus, the structure of our invention allows cables to be easily connected to a gateway device 4 mounted in holster 1 and the entire assembly to be swung inward into a position compactly fitting inside cabinet 10.

Figure 5:
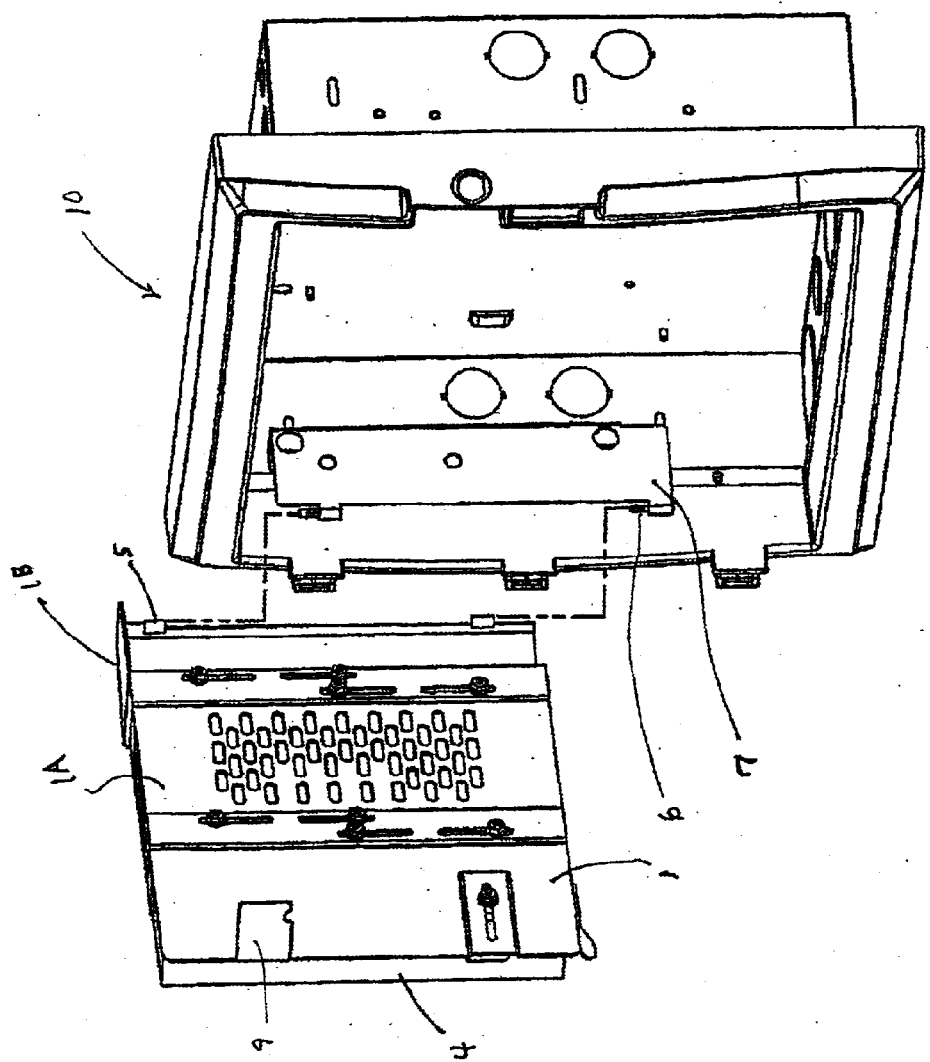
FIG. 5 provides a perspective view illustrating the manner in which the hinged electronic component holder of this invention is hinged to, and can be detached from, a component cabinet.

Further, when holster 1 is in its "open" position, the controls on gateway device 4 (just like its cables) can be readily accessed and adjusted. This allows its controls to be adjusted either before or after connecting its cables. Moreover, both cables and controls can be manipulated and/or adjusted at any time without detaching and removing the gateway device 4 from cabinet 10 by merely swinging it outward on hinges 5. Finally, as illustrated in FIG. 5, our holster 1 can be easily removed when in its open position. This greatly facilitates replacement and/or servicing of gateway device 4, as gateway device 4 can be removed from the component cabinet 10 without having to detach it from holster 1. However, it is provided with a catch member 9 that can be inserted into a slot or under an obstruction so as to prevent the holster 1 from being raised and released when it is in a closed position. Catch member 9 can also serve as a snap catch via indent 9A.

We claim:

1. A home networking system with a gateway device holder, comprising:
    a) a home networking system including a gateway device for said system;
    b) a gateway device holding structure holding said gateway device; and
    c) hinge connectors attached to said gateway device holding structure, which hinge connectors allow the gateway device holding structure with the gateway device held therein to swing in and out from a location in which it is mounted.

2. A home networking system with a gateway device holder, as described in claim 1, wherein the gateway device holding structure allows substantially open air circulation to the gateway device held therein.

3. A gateway device holder, comprising:
    a) a gateway device holding structure; and
    b) hinge connectors attached to said gateway device holding structure, which hinge connectors allow the gateway device holding structure with any gateway device held therein to swing in and out from a location in which it is mounted and which hinge connectors are disconnectable so as to allow the removal of the gateway device holding structure from a location in which it is mounted.

4. A gateway device holder, as described in claim 3, wherein the gateway device holding structure allows substantially open air circulation to a gateway device held therein.

5. A gateway device holder, as described in claim 3, wherein said gateway device holding structure is adjustable to allow placement of different sized gateway devices therein.

6. A gateway device holder, as described in claim 4, wherein said gateway device holding structure is adjustable to allow placement of different sized gateway devices therein.

7. A gateway device holder, as described in claim 3, wherein said gateway device holding structure is adapted for placement of the hinge connectors adjacent a cable connecting side of a gateway device placed in said gateway device holding structure.

8. A gateway device holder, as described in claim 7, wherein said hinge connectors are attached to a portion of the gateway device holding structure that is spaced apart from a location where a cable of the gateway device held by the gateway device holder would connect so that the hinge connectors do not interfere with the connection of said cable between said gateway device and said location.

9. A gateway device holder, as described in claim 3, wherein said gateway device holding structure is adapted for placement of the hinge connectors opposite a control bearing side of a gateway device placed in said gateway device holding structure.

10. A gateway device holder, as described in claim 3, further comprising means for holding the gateway device holding structure in a closed position.

11. A gateway device holder, comprising:
    a) a gateway device holding structure, which gateway device holding structure is adjustable to allow placement of different sized gateway devices therein; and
    b) hinge connectors attached to said gateway device holding structure, which hinge connectors allow the gateway device holding structure with any gateway device held therein to swing in and out from a location in which it is mounted.

12. A gateway device holder, as described in claim 11, wherein the gateway device holding structure allows substantially open air circulation to a gateway device held therein.

13. A gateway device holder, as described in claim 11, wherein said gateway device holding structure is adapted for placement of the hinge connectors adjacent a cable connecting side of a gateway device placed in said gateway device holding structure.

14. A gateway device holder, as described in claim 13, wherein said hinge connectors are attached to a portion of the gateway device holding structure that is spaced apart from a location where a cable of the gateway device held by the gateway device holder would connect so that the hinge connectors do not interfere with the connection of said cable between said gateway device and said location.

15. A gateway device holder, as described in claim 11, wherein said gateway device holding structure is adapted for placement of the hinge connectors opposite a control bearing side of a gateway device placed in said gateway device holding structure.

16. A gateway device holder, as described in claim 11, further comprising means for holding the gateway device holding structure in a closed position.

17. A gateway device holder, comprising:
    a) a gateway device holding structure;
    b) hinge connectors attached to said gateway device holding structure, which hinge connectors allow the gateway device holding structure with any gateway device held therein to swing in and out from a location in which it is mounted; and
    c) a mounting brace to which said hinge connectors attach, said mounting brace being adapted for mounting to an electronic component cabinet.

18. A home networking system with a combination electronic component cabinet and gateway device holder, comprising:
    a) said home networking system including a gateway device for said system;
    b) a gateway device holding structure holding said gateway device;
    c) an electronic component cabinet holding electronic components of said home networking system; and
    d) hinge connectors attached to said gateway device holding structure, which hinge connectors allow the gateway device holding structure with the gateway device held therein to swing in and out from a location in which it is mounted in said electronic component cabinet.

19. A home networking system with a combination electron component cabinet and gateway device holder, as described in claim 18, wherein the gateway device holding structure allows substantially open air circulation to a gateway device held therein.

20. A combination electronic component cabinet and gateway device holder, comprising:
 a) a gateway device holding structure;
 b) an electronic component cabinet; and
 c) hinge connectors attached to said gateway device holding structure, which hinge connectors allow the gateway device holding structure with any gateway device held therein to swing in and out from a location in which it is mounted in said electronic component cabinet and which hinge connectors are disconnectable so as to allow the removal of the gateway device holding structure from said location in which it is mounted in said cabinet.

21. A combination electronic component cabinet and gateway device holder, as described in claim 20, wherein the gateway device holding structure allows substantially open air circulation to a gateway device held therein.

22. A combination electronic component cabinet and gateway device holder, as described in claim 20, wherein said gateway device holding structure is adjustable to allow placement of different sized gateway devices therein.

23. A combination electronic component cabinet and gateway device holder, as described in claim 21, wherein said gateway device holding structure is adjustable to allow placement of different sized gateway devices therein.

24. A combination electronic component cabinet and gateway device holder, comprising:
 a) a gateway device holding structure, which gateway device holding structure is adjustable to allow placement of different sized gateway devices therein;
 b) an electronic component cabinet; and
 c) hinge connectors attached to said gateway device holding structure, which hinge connectors allow the gateway device holding structure with any gateway device held therein to swing in and out from a location in which it is mounted in said electronic component cabinet.

25. A combination electronic component cabinet and gateway device holder, as described in claim 24, wherein the gateway device holding structure allows substantially open air circulation to a gateway device held therein.

26. A combination electronic component cabinet and gateway device holder, comprising:
 a) a gateway device holding structure;
 b) an electronic component cabinet;
 c) hinge connectors attached to said gateway device holding structure, which hinge connectors allow the gateway device holding structure with any gateway device held therein to swing in and out from a location in which it is mounted in said electronic component cabinet; and
 d) a mounting brace to which said hinge connectors attach, said mounting brace being adapted for mounting to the electronic component cabinet.

\* \* \* \* \*